(12) United States Patent
Izumi et al.

(10) Patent No.: US 11,462,561 B2
(45) Date of Patent: Oct. 4, 2022

(54) SEMICONDUCTOR DEVICE AND MANUFACTURING METHOD THEREOF

(71) Applicant: Kioxia Corporation, Minato-ku (JP)

(72) Inventors: Takashi Izumi, Yokkaichi (JP);
Akitsugu Hatazaki, Yokkaichi (JP);
Masaaki Hatano, Yokkaichi (JP);
Tatsumi Usami, Kuwana (JP)

(73) Assignee: Kioxia Corporation, Minato-ku (JP)

( * ) Notice: Subject to any disclaimer, the term of this patent is extended or adjusted under 35 U.S.C. 154(b) by 123 days.

(21) Appl. No.: 17/005,814

(22) Filed: Aug. 28, 2020

(65) Prior Publication Data

US 2021/0074722 A1 Mar. 11, 2021

(30) Foreign Application Priority Data

Sep. 5, 2019 (JP) .............................. JP2019-161988

(51) Int. Cl.
| | | |
|---|---|---|
| *H01L 27/11575* | (2017.01) | |
| *H01L 27/11582* | (2017.01) | |
| *H01L 23/00* | (2006.01) | |
| *H01L 27/11556* | (2017.01) | |

(52) U.S. Cl.
CPC ........ *H01L 27/11582* (2013.01); *H01L 24/43* (2013.01); *H01L 24/45* (2013.01); *H01L 27/11556* (2013.01); *H01L 27/11575* (2013.01)

(58) Field of Classification Search
CPC ............... H01L 24/45; H01L 27/11556; H01L 27/11582
See application file for complete search history.

(56) References Cited

U.S. PATENT DOCUMENTS

| | | | |
|---|---|---|---|
| 6,539,625 B2 | 4/2003 | Engel et al. | |
| 6,699,786 B2 | 3/2004 | Liu | |
| 2003/0091870 A1 | 5/2003 | Bhowmik et al. | |
| 2008/0067583 A1* | 3/2008 | Kidoh ............... | H01L 29/66825 257/326 |

(Continued)

FOREIGN PATENT DOCUMENTS

| | | |
|---|---|---|
| EP | 1 094 504 A2 | 4/2001 |
| JP | 2001-200358 A | 7/2001 |

(Continued)

OTHER PUBLICATIONS

Liu, Z., et al., "Formation Mechanism of Metal-Oxides on Plasma-Exposed $WSi_x$/poly Si Gate Stacks," Japanese Journal of Applied Physics, vol. 38, Feb. 15, 1999, pp. L 209-L 211.

(Continued)

*Primary Examiner* — Sarah K Salerno
(74) *Attorney, Agent, or Firm* — Oblon, McClelland, Maier & Neustadt, L.L.P.

(57) ABSTRACT

According to one embodiment, a semiconductor device includes: a wiring layer including a first metallic film provided on an oxide film, a second metallic film provided on the first metallic film, and a polysilicon film provided on the second metallic film; and an element layer provided on the wiring layer and including semiconductor elements electrically connected to the first metallic film. Standard Gibbs energy of formation of a first metal included in the first metallic film is lower than that of a second metal included in the second metallic film.

10 Claims, 11 Drawing Sheets

(56) References Cited

U.S. PATENT DOCUMENTS

2020/0091164 A1\* 3/2020 Liu .................. H01L 27/11548

FOREIGN PATENT DOCUMENTS

| JP | 2001-351878 | A |   | 12/2001 |               |
|----|-------------|---|---|---------|---------------|
| JP | 2003-188175 | A |   | 7/2003  |               |
| JP | 4558272     | B2 |  | 10/2010 |               |
| JP | 2015149413  | A | \* | 8/2015 | ........ H01L 27/11565 |

OTHER PUBLICATIONS

Chen, C-C. et al., "Analysis of Peeling Mechanism in Annealed Tungsten Silicide Thin Films," Japanese Journal of Applied Physics, vol. 50, 2011, pp. 121802-1-121802-6.

\* cited by examiner

SEMICONDUCTOR DEVICE AND MANUFACTURING METHOD THEREOF

CROSS-REFERENCE TO RELATED APPLICATIONS

This application is based upon and claims the benefit of priority from Japanese Patent Application No. 2019-161988, filed on Sep. 5, 2019; the entire contents of which are incorporated herein by reference.

FIELD

Embodiments of the present invention relate to a semiconductor device and a manufacturing method thereof.

BACKGROUND

In a three-dimensional stacked semiconductor memory being an example of semiconductor devices, there is a case where some metallic lines are formed below a stack body including memory cells and the like in order to reduce the area of the memory cells. For example, an oxide film is used as a base for the metallic lines.

DETAILED DESCRIPTION

Embodiments will now be explained with reference to the accompanying drawings. The present invention is not limited to the embodiments.

A semiconductor device according to one embodiment includes: a wiring layer including a first metallic film provided on an oxide film, a second metallic film provided on the first metallic film, and a polysilicon film provided on the second metallic film; and an element layer provided on the wiring layer and including semiconductor elements electrically connected to the first metallic film. Standard Gibbs energy of formation of a first metal included in the first metallic film is lower than that of a second metal included in the second metallic film.

While the present invention is applied to a buried source line (BSL) of a three-dimensional stacked semiconductor memory in the following embodiments, the present invention may be also applied to metallic lines other than buried source line. The present invention may be also applied to metallic lines of a semiconductor device other than a three-dimensional stacked semiconductor memory.

First Embodiment

Figure 1:
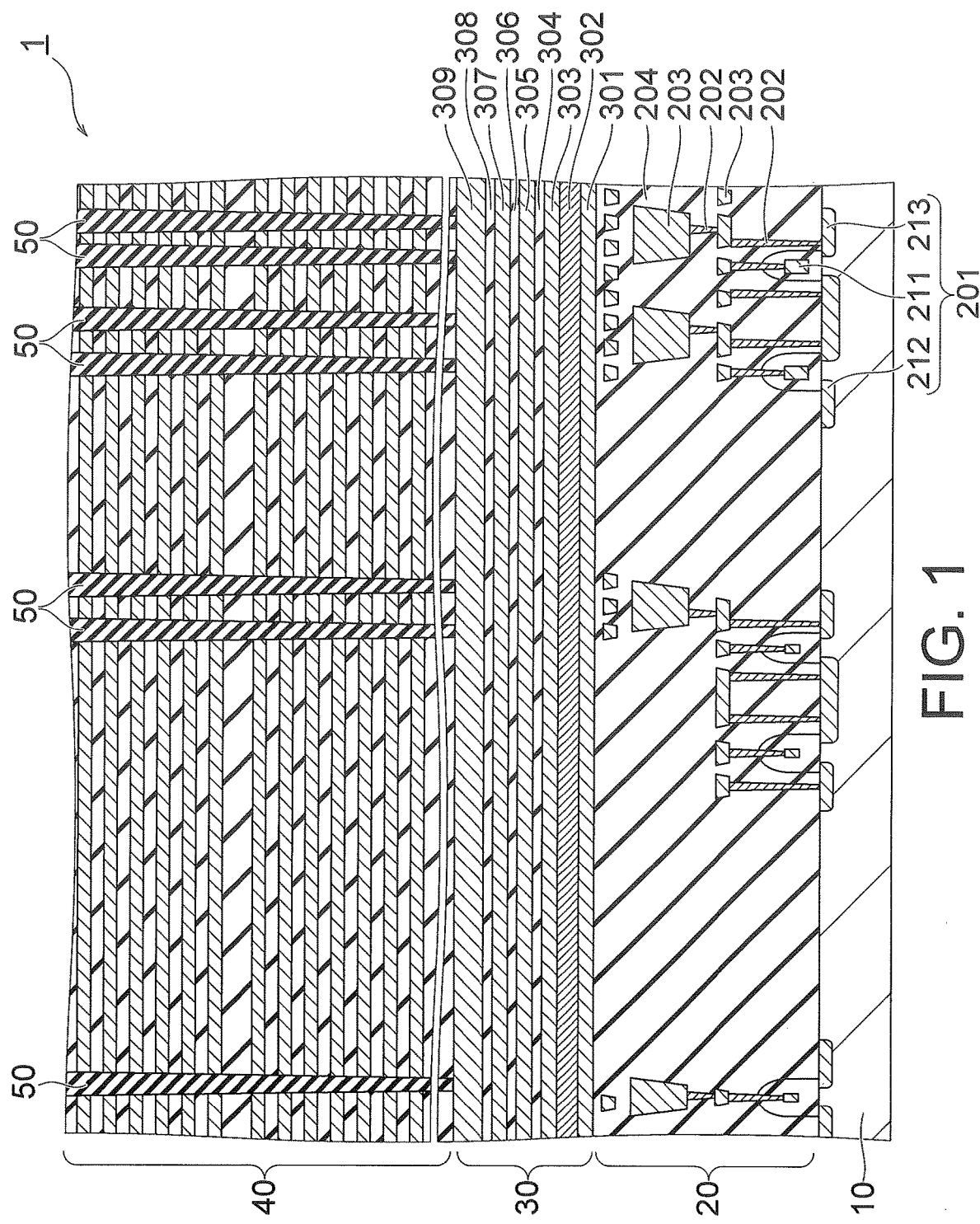
FIG. 1 is a sectional view illustrating a schematic configuration of a semiconductor device according to a first embodiment.

FIG. 1 is a sectional view illustrating a schematic configuration of a semiconductor device according to a first embodiment. A semiconductor device 1 illustrated in FIG. 1 includes a semiconductor substrate 10, a circuit layer 20, a wiring layer 30, and an element layer 40.

The semiconductor substrate 10 is a silicon substrate, for example. The circuit layer 20 is provided on the semiconductor substrate 10.

A plurality of transistors 201 are provided on a bottom part of the circuit layer 20. Each of the transistors 201 includes a gate electrode 211, and diffused layers 212 and 213 diffused on the surface of the semiconductor substrate 10. One of the diffused layers 212 and 213 is a drain region and the other one is a source region. When a predetermined voltage is applied to the gate electrode 211, a current flow between the diffused layer 212 and the diffused layer 213.

A plurality of contact plugs 202 and a plurality of pads 203 are arranged alternately on layers on the transistors 201. The contact plugs 202 in the lowermost layer are individually connected to the gate electrodes 211, the diffused layers 212, and the diffused layers 213. In the circuit layer 20, the transistors 201, the contact plugs 202, and the pads 203 constitute a driving circuit for memory elements formed in the element layer 40.

The gate electrodes 211, the contact plugs 202, and the pads 203 of the transistors 201 are covered by an interlayer dielectric film 204 in the circuit layer 20. The interlayer dielectric film 204 is a silicon dioxide ($SiO_2$) film, for example. The wiring layer 30 is located on the interlayer dielectric film 204.

In the wiring layer 30, a first metallic film 301 is located on the interlayer dielectric film 204. The first metallic film 301 includes, for example, at least one of titanium (Ti), zirconium (Zr), and hafnium (Hf) as a first metal. A second metallic film 302 is located on the first metallic film 301. The first metallic film 301 is provided to prevent the second metallic film 302 from being peeled off the interlayer dielectric film 204.

The second metallic film 302 includes tungsten (W) and silicon, for example. Tungsten is an example of a second metal. The second metallic film 302 has a larger thickness than the first metallic film 301. The second metallic film 302 functions as a buried source line for energizing memory elements formed in the element layer 40. To reduce the electrical resistance of the second metallic film 302, it is desirable that a larger amount of tungsten is included in the second metallic film 302 than silicon. The composition ratio x of tungsten/silicon preferably meets $2<x<3$.

A polysilicon film 303 is provided on the second metallic film 302. In the present embodiment, crystal grains of tungsten and silicon included in the second metallic film 302 are (001) oriented to enhance adhesiveness to the polysilicon film 303. In other words, the crystal grains of tungsten and silicon are oriented in a plane direction in which the diffraction peak intensity is highest.

The polysilicon film 303 is a P-type silicon film. The polysilicon film 303 has a larger thickness than the first metallic film 301. The upper surface of the polysilicon film 303 is covered by an insulating film 304. The insulating film 304 is a silicon dioxide film, for example.

An amorphous silicon film 305 is provided on the insulating film 304. The amorphous silicon film 305 includes no impurities. The upper surface of the amorphous silicon film 305 is covered by an insulating film 306. The insulating film 306 is also a silicon dioxide film similarly to the insulating film 304.

A polysilicon film 307 is provided on the insulating film 306. The polysilicon film 307 is insulated from the amorphous silicon film 305 by the insulating film 306. The polysilicon film 307 includes no impurities. The upper surface of the polysilicon film 307 is covered by an insulating film 308. The insulating film 308 is also a silicon dioxide film similarly to the insulating film 304.

A polysilicon film 309 is provided on the insulating film 308. The polysilicon film 309 is insulated from the polysilicon film 307 by the insulating film 308. The polysilicon film 309 is a P-type silicon film. The polysilicon film 309 is one of selection gate (SG) lines for selecting a memory element to be driven. The element layer 40 is located on the polysilicon film 309.

Figure 2:
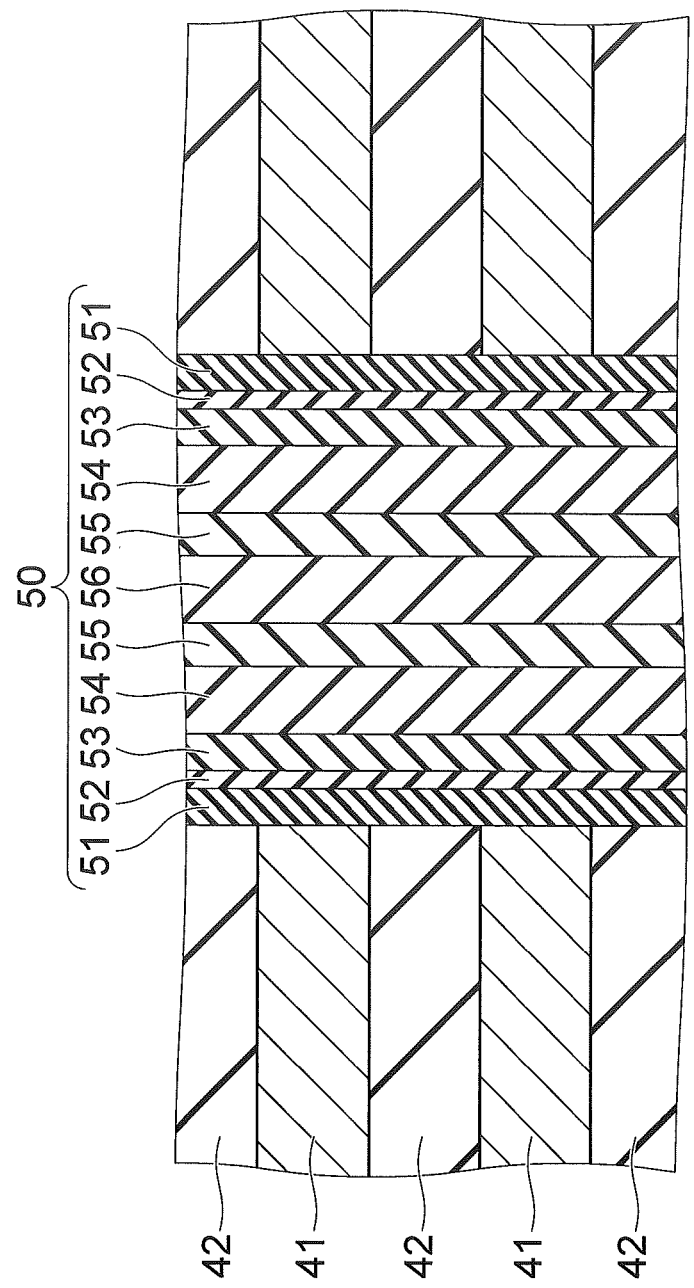
FIG. 2 is a sectional view illustrating a part of an element layer in an enlarged manner.

FIG. 2 is a sectional view illustrating a part of the element layer 40 in an enlarged manner. As illustrated in FIG. 2, the element layer 40 includes electrode layers 41, insulating layers 42, and memory element films 50. The memory element films 50 are an example of semiconductor elements.

The electrode layers 41 and the insulating layers 42 are alternately stacked. The electrode layers 41 include tungsten, for example, and function as word lines of memory elements. The insulating layers 42 are silicon dioxide films, for example. The electrode layers 41 are insulated by the insulating layers 42.

The memory element films 50 penetrate through a stack body formed of the electrode layers 41 and the insulating layers 42. As illustrated in FIG. 2, each of the memory element films 50 includes a barrier film 51, a block insulating film 52, a charge storage film 53, a tunnel insulating film 54, a channel film 55, and a core insulating film 56.

The barrier film 51 includes carbon, silicon, and nitrogen, for example, and faces the electrode layers 41 and the insulating layers 42. The block insulating film 52 includes silicon dioxide, for example, and faces the inner circumferential surface of the barrier film 51. The charge storage film 53 includes silicon nitride (SiN), for example, and faces the inner circumferential surface of the block insulating film 52. The tunnel insulating film 54 includes silicon oxynitride (SiON), for example, and faces the inner circumferential surface of the charge storage film 53. The channel film 55 includes polysilicon, for example, and faces the inner circumferential surface of the tunnel insulating film 54. The channel film 55 is electrically connected to the first metallic film 301 described above. The core insulating film 56 includes silicon dioxide, for example, and faces the inner circumferential surface of the channel film 55. In each of the memory element films 50, electrons can be accumulated in the charge storage film 52 by energizing the electrode layers 41 and the channel film 55.

A manufacturing method of a semiconductor device according to the present embodiment is explained below. A process of manufacturing the wiring layer 30 and the element layer 40 is explained here.

Figure 3:
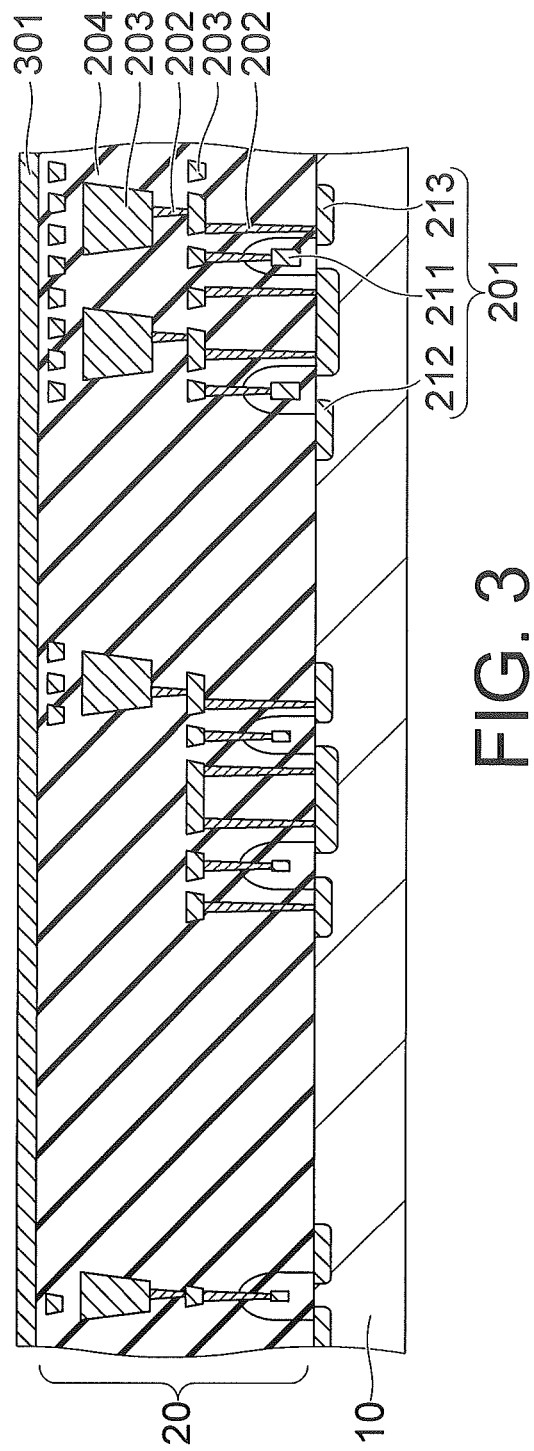
FIG. 3 is a sectional view explaining a forming process of a first metallic film.

First, the first metallic film 301 is formed on the interlayer dielectric film 204 of the circuit layer 20 as illustrated in FIG. 3. For example, the first metallic film 301 can be formed by sputtering, CVD (Chemical Vapor Deposition), or ALD (Atomic Layer Deposition).

Figure 4:
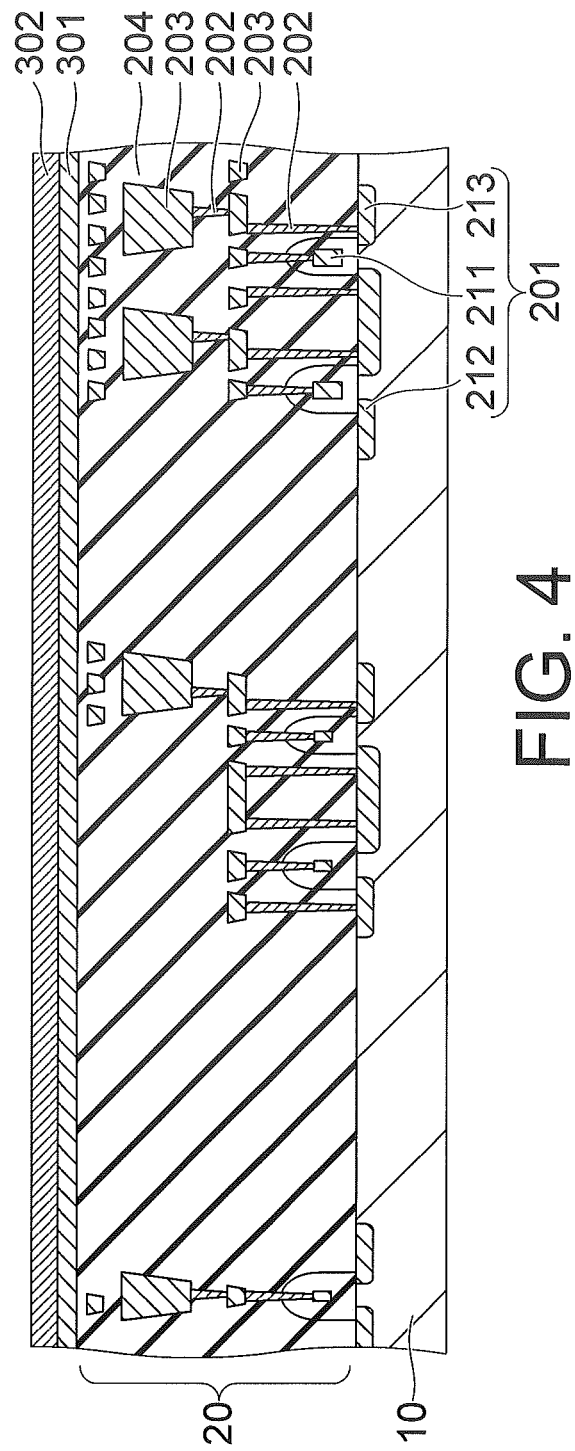
FIG. 4 is a sectional view explaining a forming process of a second metallic film.

Next, the second metallic film 302 is formed on the first metallic film 301 as illustrated in FIG. 4. The second metallic film 302 can be also formed by sputtering, CVD, or ALD similarly to the first metallic film 301. Subsequently, the second metallic film 302 is annealed to cause the crystal grains of silicon and tungsten included in the second metallic film 302 to be (001) oriented.

Figure 5:
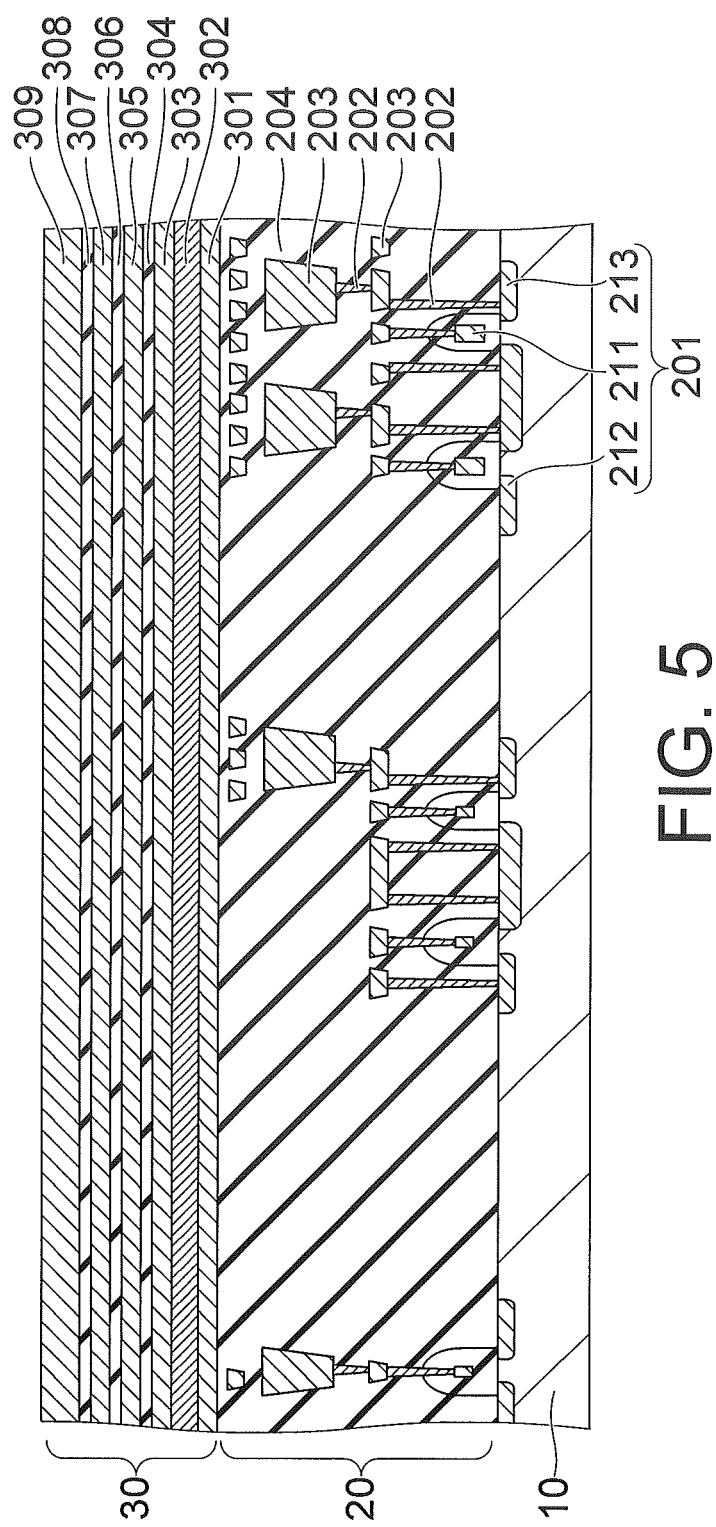
FIG. 5 is a sectional view explaining a film forming process of a wiring layer.

Thereafter, the polysilicon film 303, the insulating film 304, the amorphous silicon film 305, the insulating film 306, the polysilicon film 307, the insulating film 308, and the polysilicon film 309 are sequentially formed on the second metallic film 302 as illustrated in FIG. 5. The wiring layer 30 is completed in this manner. Since these films can be formed by a generally used film formation method, explanations thereof are omitted.

Figure 6:
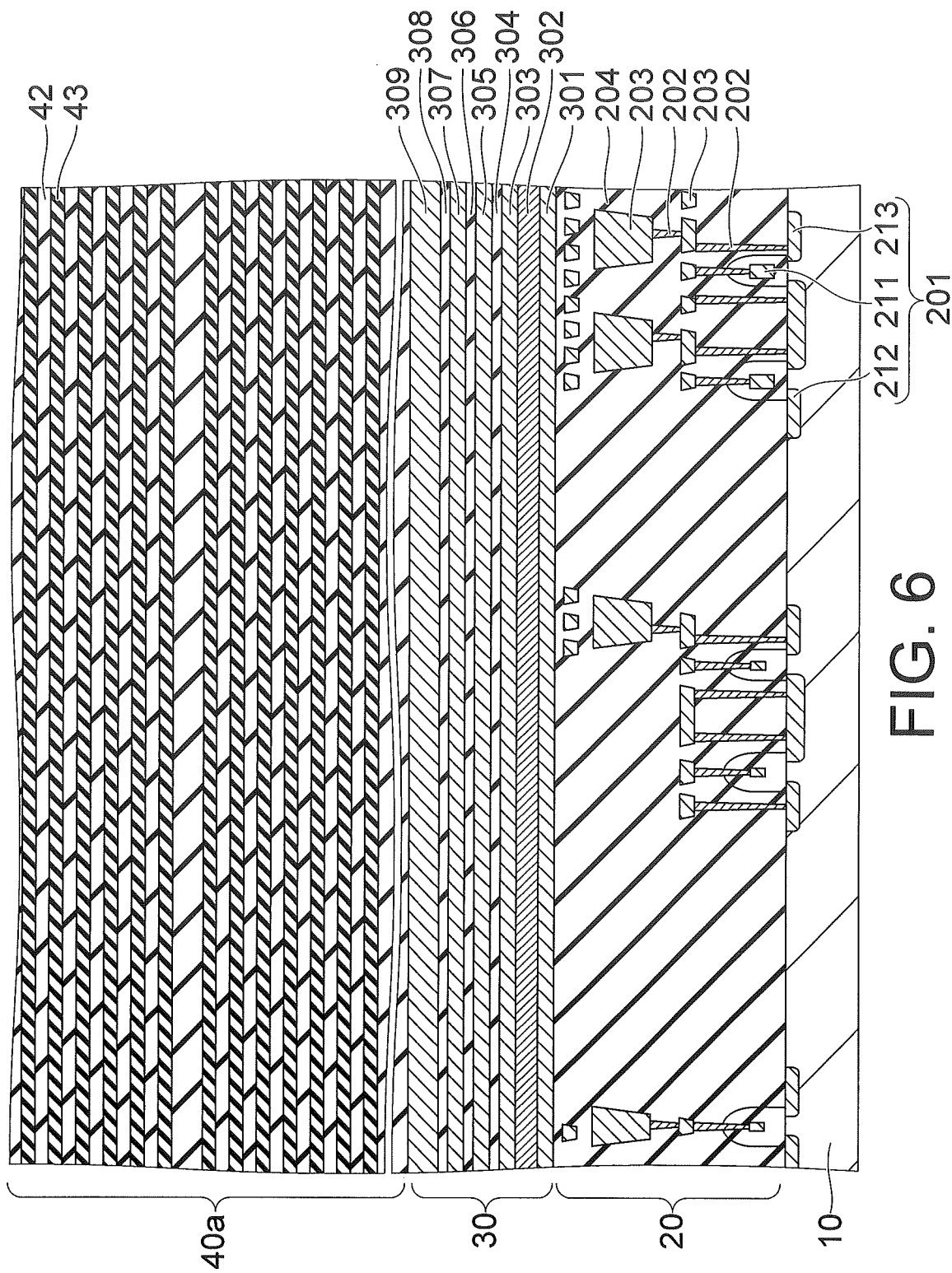
FIG. 6 is a sectional view explaining a forming process of a stack body.

Next, a stack body 40a is formed by alternately stacking the insulating layers 42 and sacrificial layers 43 on the wiring layer 30 as illustrated in FIG. 6. The sacrificial layers 43 are silicon nitride films, for example. For example, the sacrificial layers 43 can be formed by alternately introducing a material gas including silicon and a reducing gas reducing silicon into a high-temperature chamber.

Figure 7:
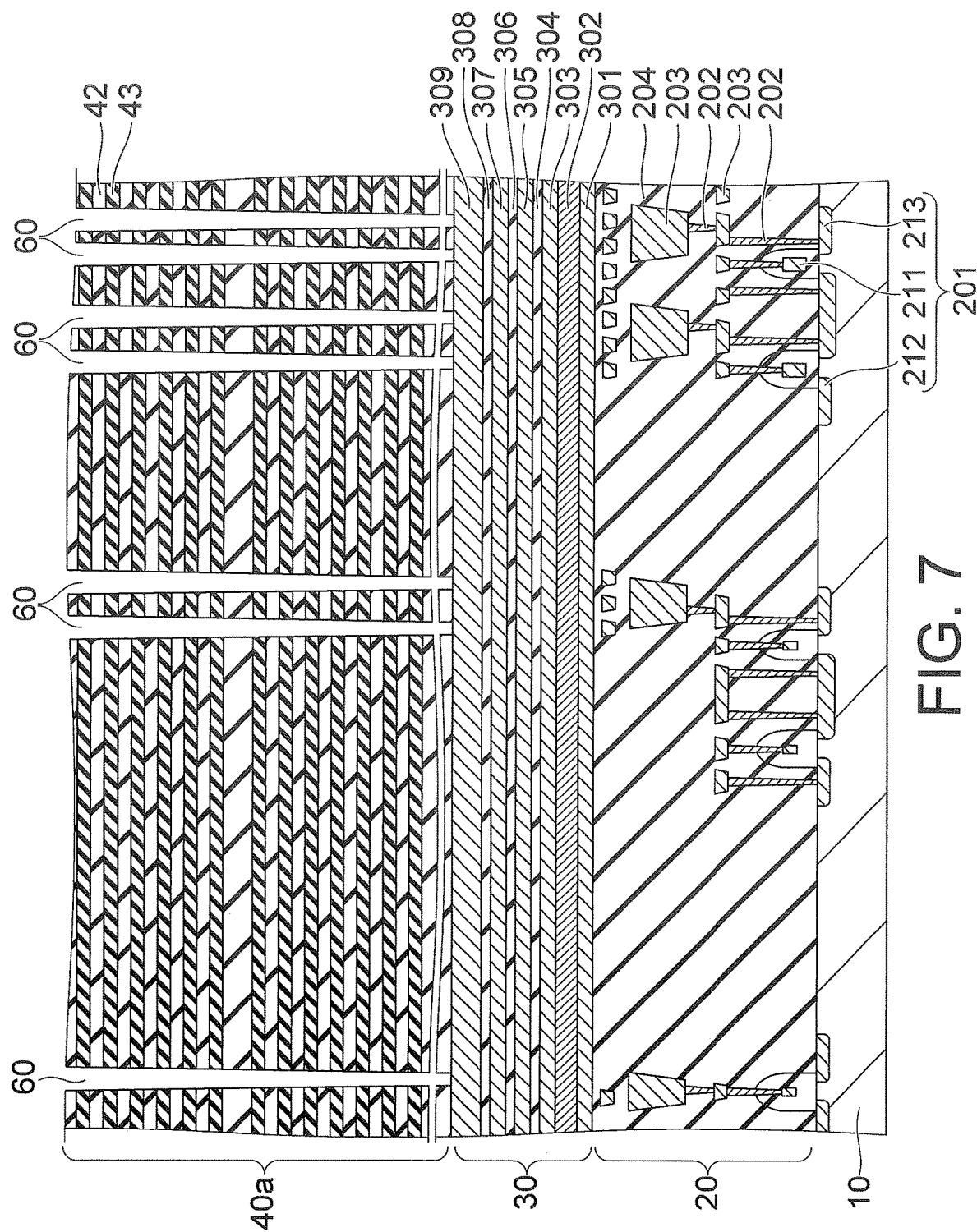
FIG. 7 is a sectional view explaining a forming process of holes.

Subsequently, holes 60 are formed in the stack body 40a as illustrated in FIG. 7. For example, the holes 60 can be formed by RIE (Reactive Ion Etching) using a gas including chlorine ($Cl_2$).

Figure 8:
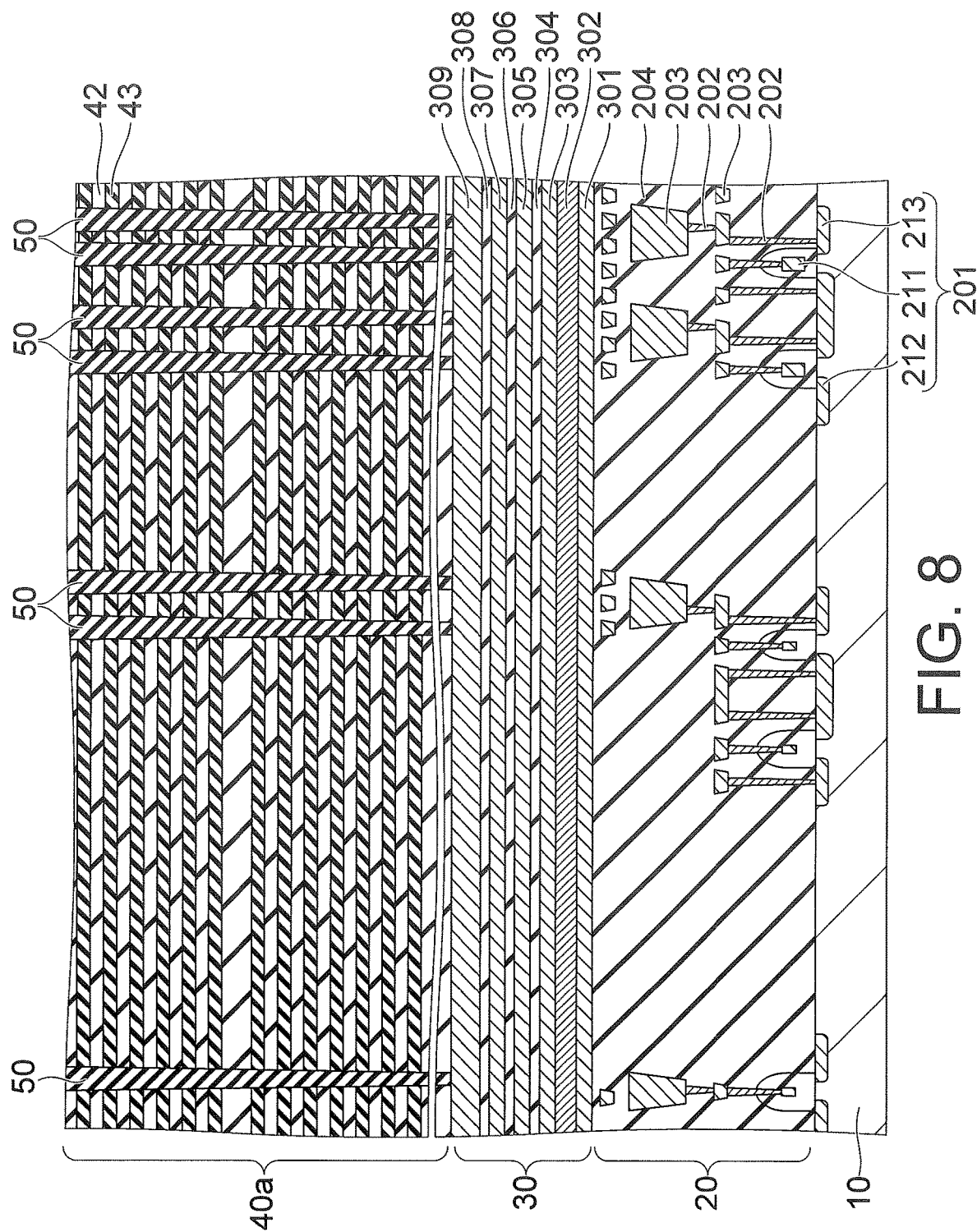
FIG. 8 is a sectional view explaining a forming process of memory element films.
Figure 9:
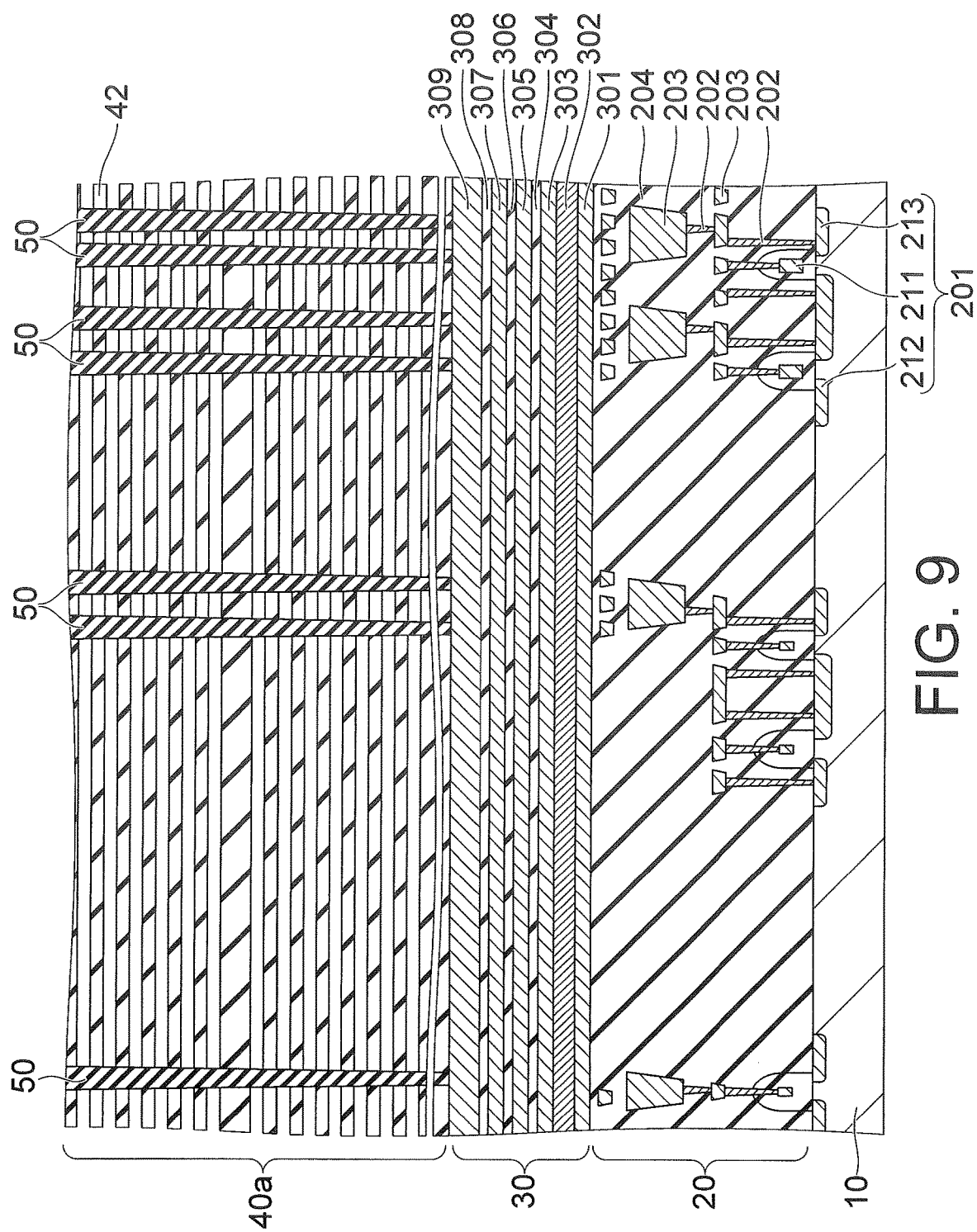
FIG. 9 is a sectional view explaining a removing process of sacrificial layers.

Next, the memory element film 50 is formed in the holes 60 as illustrated in FIG. 8. Subsequently, the sacrificial layers 43 are removed as illustrated in FIG. 9. The sacrificial layers 43 can be removed by, for example, using a phosphoric acid solution. Thereafter, the electrode layers 41 are formed in voids generated by removal of the sacrificial layers 43 as illustrated in FIG. 1.

In the manufacturing process of the semiconductor device 1 according to the present embodiment described above, hydrogen included in the reducing gas is released at the formation of the sacrificial layers 43 illustrated in FIG. 6. At this time, the second metallic film 302 tends to be peeled off the interlayer dielectric film 204 due to abnormal oxidation, if the first metallic film 301 is not formed and the second metallic film 302 is formed directly on the interlayer dielectric film 204.

Therefore, in the present embodiment, the first metallic film 301 is formed between the second metallic film 302 and the interlayer dielectric film 204. The first metal included in the first metallic film 301 is explained below with reference to FIG. 10.

Figure 10:
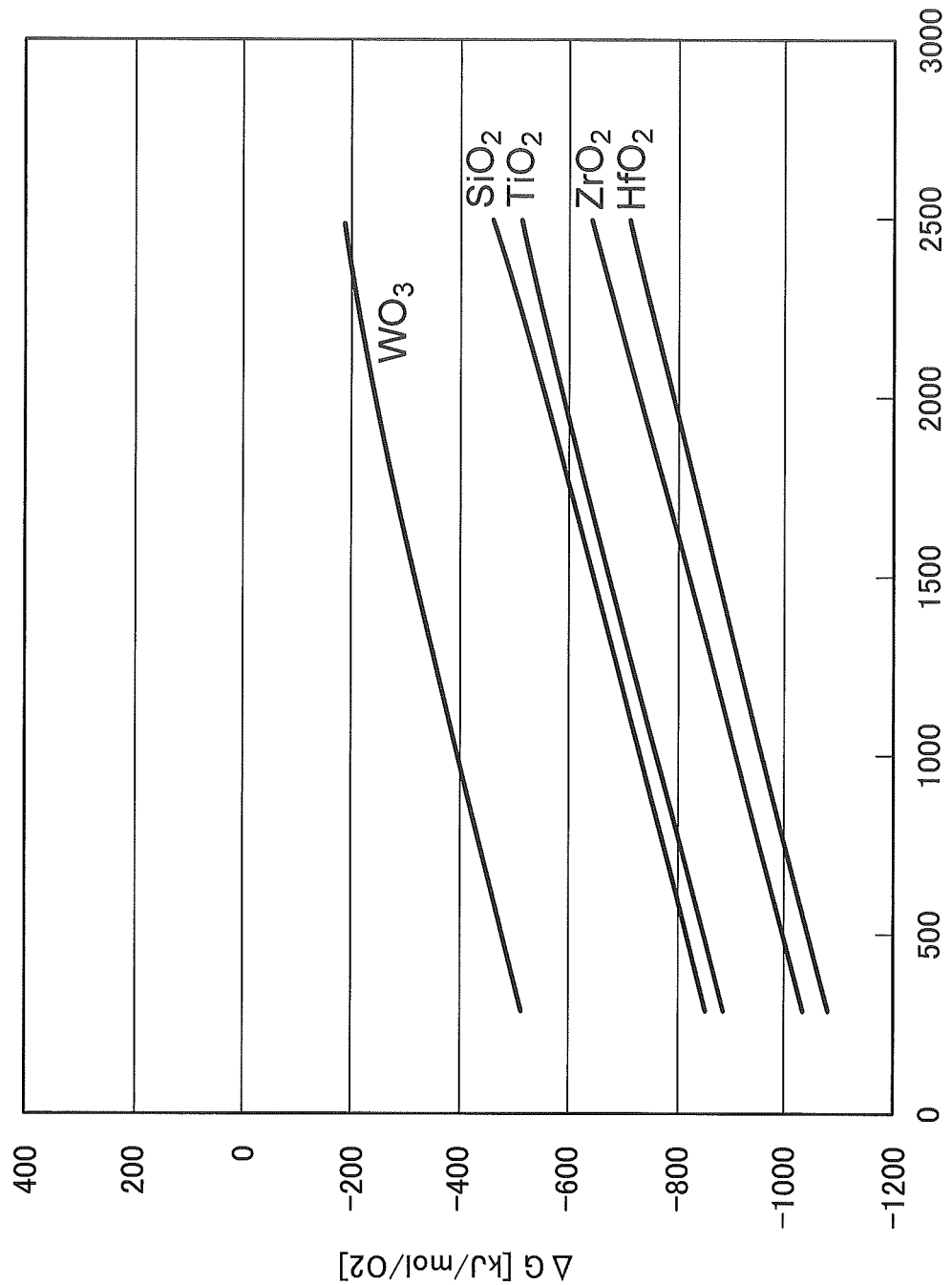
FIG. 10 is an Ellingham diagram illustrating standard Gibbs energy of formation of metal oxides at each temperature.

FIG. 10 is an Ellingham diagram illustrating standard Gibbs energy of formation of metal oxides at each temperature. In the present embodiment, the second metal included in the second metallic film 302 is tungsten. Therefore, it is desirable that the standard Gibbs energy of formation of the first metal included in the first metallic film 301 is lower than that of tungsten. Specifically, the first metal is desirably at least any of titanium, zirconium, and hafnium.

When the metals listed above are included in the first metallic film 301, the oxidizability of the first metallic film 301 is higher than that of the second metallic film 302. Therefore, the first metallic film 301 is less likely to be reduced by hydrogen and the adhesiveness to the interlayer dielectric film 204 enhances. Accordingly, the second metallic film 302 can be suppressed from being peeled off an oxide film.

Although the polysilicon film 303 is conventionally formed thicker than necessary to avoid reduction with hydrogen, the first metallic film 301 enables the polysilicon film 303 to be suppressed to a minimum necessary thickness. The first metallic film 301 is thinner than the second metallic film 302 or the polysilicon film 303. Accordingly, the effect of thinning of the polysilicon film 303 is larger even if the film thickness in the semiconductor device 1 increases due to the first metallic film 301.

Further, the crystal grains of tungsten and silicon in the second metallic film 302 are (001) oriented in the present embodiment. Therefore, the adhesiveness between the second metallic film 302 and the polysilicon film 303 enhances. Accordingly, peeling-off of the second metallic film 302 from the polysilicon film 303 can be also suppressed.

Second Embodiment

Figure 11:
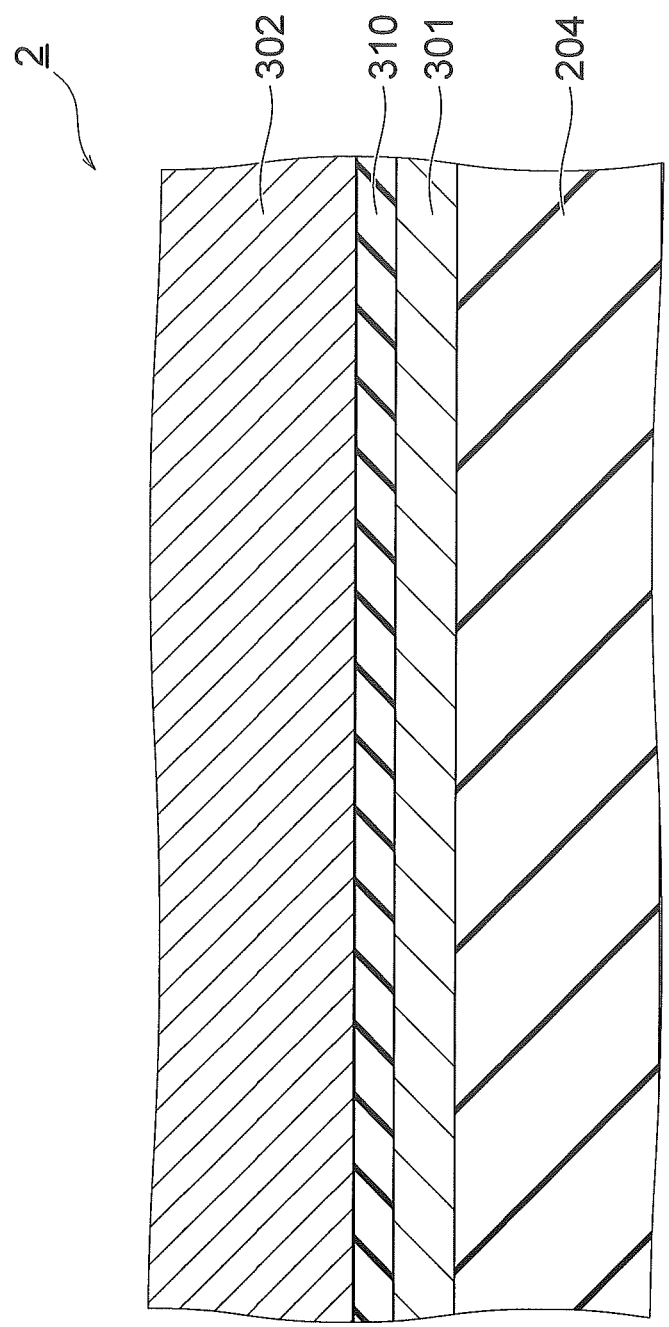
FIG. 11 is a sectional view illustrating relevant parts of a semiconductor device according to a second embodiment in an enlarged manner.

FIG. 11 is a sectional view illustrating relevant parts of a semiconductor device according to a second embodiment in an enlarged manner. Constituent elements that are identical to those of the first embodiment described above are denoted by like reference signs and detailed descriptions thereof are omitted.

In a semiconductor device 2 according to the second embodiment, a nitride film 310 is formed between the first metallic film 301 and the second metallic film 302 as illustrated in FIG. 11. The nitride film 310 includes a nitride of a metal included in the first metallic film 301. Similarly to the first metallic film 301, the nitride film 310 can be formed by sputtering, CVD, or ALD.

For example, when the first metallic film 301 includes zirconia, the zirconia sometimes metallically reacts with tungsten or silicon included in the second metallic film 302 in thermal processing. Therefore, in the present embodiment, the metallic reaction is suppressed by forming the nitride film 310 between the first metallic film 301 and the second metallic film 302.

According to the present embodiment explained above, similarly to the first embodiment, the first metallic film 301 can suppress the second metallic film 302 from being peeled off each of the interlayer dielectric film 204 and the polysilicon film 303. Furthermore, the metallic reaction between the first metallic film 301 and the second metallic film 302 can be also suppressed by the nitride film 310.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:
    a wiring layer including a first metallic film provided on an oxide film, a second metallic film provided directly on the first metallic film, and a polysilicon film provided on the second metallic film;
    an element layer provided on the wiring layer and including memory element films electrically connected to the first metallic film; and
    a circuit layer under the wiring layer,
    wherein
    standard Gibbs energy of formation of a first metal included in the first metallic film is lower than that of a second metal included in the second metallic film, and
    the circuit layer includes the oxide film and transistors covered by the oxide film, and the transistors are placed directly under the memory element films via the wiring layer.

2. The device of claim 1, wherein
    the first metal is at least one of titanium (Ti), zirconium (Zr), and hafnium (Hf), and
    the second metal is tungsten.

3. The device of claim 1, further comprising a nitride film including a nitride of the first metal between the first metallic film and the second metallic film.

4. The device of claim 1, wherein the second metallic film includes the second metal and silicon, and the second metallic film is (001) oriented.

5. The device of claim 1, wherein the first metallic film is thinner than the second metallic film.

6. A manufacturing method of a semiconductor device, the method comprising:
    forming a circuit layer including transistors and an oxide film,
    forming a wiring layer on the oxide film, the wiring layer including a first metallic film including a first metal, a second metallic film including a second metal having higher standard Gibbs energy of formation than the first metal, and a polysilicon film, where the films being sequentially stacked; and
    forming an element layer on the wiring layer, the element layer including memory element films electrically connected to the first metallic film, wherein
    the polysilicon film is formed directly on the second metallic film, and
    the transistors are formed directly under the memory element films via the wiring layer.

7. The method of claim 6, wherein
    the first metal is at least one of titanium (Ti), zirconium (Zr), and hafnium (Hf), and
    the second metal is tungsten.

8. The method of claim 6, further comprising forming a nitride film including a nitride of the first metal between the first metallic film and the second metallic film.

9. The method of claim 6, wherein the second metallic film includes the second metal and silicon, and the second metallic film is (001) oriented.

10. The method of claim 6, wherein the first metallic film is formed to be thinner than the second metallic film.

* * * * *